(12) United States Patent
Williams et al.

(10) Patent No.: US 6,807,646 B1
(45) Date of Patent: Oct. 19, 2004

(54) SYSTEM AND METHOD FOR TIME SLICING DETERMINISTIC PATTERNS FOR RESEEDING IN LOGIC BUILT-IN SELF-TEST

(75) Inventors: Thomas W. Williams, Boulder, CO (US); Peter Wohl, Williston, VT (US); John A. Waicukauski, Tualatin, OR (US); Rohit Kapur, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 421 days.

(21) Appl. No.: 10/091,614

(22) Filed: Mar. 4, 2002

(51) Int. Cl.[7] ................................................. G06F 11/00
(52) U.S. Cl. ...................... 714/736; 714/724; 714/228
(58) Field of Search .............................. 714/724, 728, 714/732, 733, 734, 736, 738, 739

(56) References Cited

U.S. PATENT DOCUMENTS 4,745,355 A * 5/1988 Eichelberger et al. ...... 714/728
4,801,870 A * 1/1989 Eichelberger et al. ...... 714/736
5,991,909 A * 11/1999 Rajski et al. ............... 714/729

* cited by examiner

*Primary Examiner*—Phung M. Chung
(74) *Attorney, Agent, or Firm*—Bever, Hoffman & Harms, LLP; Jeanette S. Harms (57) ABSTRACT

A system and method for time slicing deterministic patterns for reseeding in logic built-in self-test (BIST). The known properties of a linear feedback shift register (LFSR) and an associated set of channels are used in conjunction with a desired deterministic test pattern to create one or more seeds which can be used by the LFSR to generate the test pattern. The test pattern is divided into a number of segments, with each segment having a specific number of "care" bits. The number of shifts required to fill a segment using a particular seed is stored along with the seed as a seed lifetime. During testing, each deterministic test pattern is generated by loading a seed into the LFSR and cycling the LFSR in accordance with the lifetime of the seed. The seed lifetimes may have different values, and multiple seeds may be used in the generation of a single test pattern, or a single seed may be used to generate care bits of multiple test patterns.

26 Claims, 9 Drawing Sheets

SYSTEM AND METHOD FOR TIME SLICING DETERMINISTIC PATTERNS FOR RESEEDING IN LOGIC BUILT-IN SELF-TEST

FIELD OF THE INVENTION

Embodiments of the present invention relate to the field of built-in self-test (BIST) for logic circuits. More particularly, embodiments of the present invention relate to deterministic BIST.

BACKGROUND ART

The power and complexity of computer systems and other digital electronic devices are continually increasing, along with the level of integration of integrated circuit devices.

As the power and complexity of logic circuits increase, the volume of test data that must be applied to functionally verify a circuit, and the number of responses that must be evaluated to fully test a circuit increase as well.

At the same time the test data volume is increasing, higher levels of integration have restricted access to possible test points in the circuits. For example, the number of transistors in digital integrated circuits has increased much more rapidly than the pin counts of the packages in which they are housed. As a result, the circuit interface becomes a bottleneck for the application and evaluation of test data. The challenge of circuit testing is magnified at the board and system level as several integrated circuits may be combined. The approximate cost of testing increases by an order of magnitude with the step from chip to board, and from board to system.

Traditionally, automatic test equipment (ATE) has been used to generate test input data and evaluate the response of the circuit under test (CUT), or device under test (DUT). In order to cope with the challenge of testing increasingly complex circuits, built-in self-test (BIST) has been developed.

In BIST, circuits dedicated to testing are combined with the CUT or DUT in order to avoid the problems of external application and extraction of test data, and reduce the cost of the ATE required. There are three general BIST schemes that are currently in use for test pattern generation: exhaustive/pseudo-exhaustive testing, pseudo-random testing, and deterministic testing.

In an exhaustive testing scheme, all possible input patterns are applied to the DUT. For an n-input combinational logic circuit, $2^n$ patterns are required. Exhaustive testing will detect all irredundant faults, but the time required for testing becomes prohibitive with a large value for n. These systems are generally not commercially feasible.

Pseudo-exhaustive testing can be used to extend the applicability of exhaustive testing by partitioning the DUT into several subcircuits. However, for VLSI circuits, it may be difficult to apply a partitioning scheme that will sufficiently reduce the number of inputs to a given partition.

Pseudo-random testing uses the application of pseudo-random test patterns generated by a pseudo-random pattern generator (PRPG) such as a linear feedback shift register (LFSR) in place of truly random sequences. Although an LFSR is relatively straightforward in implementation, tradeoffs must be made between the number of test patterns, degree of fault coverage, and the handling of random pattern resistant faults.

Since random patterns have an equal probability for a test bit being a "0" or a "1," a random pattern test generators must generate a large number of patterns in order to produce sequences that are dominated by either a "0" or a "1," as are required by random pattern resistant faults. The number of required patterns can be reduced somewhat by weighting the output of a pseudo-random pattern generator to skew the probability of a "0" or a "1;" however, the most effective approach is deterministic testing.

Deterministic testing involves the computing and storing of the input test patterns and the corresponding output responses on the DUT. Automatic test pattern generators (ATPG) are used to compute the test vectors. This method is more direct than pattern generation and can be used to target specific faults, but the overhead is extremely high due to on-circuit storage requirements.

Pseudo-random and deterministic testing techniques can be combined in BIST architectures such as Self-Testing Using an MISR (multiple input signature register) and Parallel Shift Register Sequence Generator (STUMPS.) STUMPS is the most commonly used logic BIST in use today. The basic structure used to test circuitry is an LFSR that feeds pseudo-random data through parallel chains (called channels) that are each associated with a section of the DUT. The responses are captured in the channels and scanned out into a MISR and compacted. In addition to generating pseudo-random patterns, the LFSR may also be loaded with specific initial values (seeds) that are derived on the basis of a set of required deterministic test patterns, which are found within the output of the LFSR once the proper seed is loaded.

Typically, an LFSR will be cycled many times in order to generate a large set of pseudo-random test patterns. In addition to the pseudo-random phase of testing, the LFSR will be seeded in order to produce deterministic bit sequences. Due to constraints on the composition of the deterministic test patterns, the seeds used for generation of the deterministic patterns can only be used for a relatively small number of cycles, and a number of seeds are usually used to provide a complete test pattern, with each seed providing the same number of bit sequences to the channels.

Although the STUMPS architecture has been used to improve the efficiency of BIST by combining pseudo-random and deterministic testing, the conventional practice of using each deterministic seed to provide a fixed number of bit sequences fails to maximize the efficiency of deterministic testing using STUMPS. This is in part due to the variability of the test patterns and their associated needs of values in scan cells.

SUMMARY OF INVENTION

Accordingly, embodiments of the present invention provide a method for improving the efficiency of deterministic testing using a variation of the STUMPS architecture. Embodiments of the present invention improve the performance of built-in self-test (BIST) by using a plurality of seeds with variable lifetimes (clock cycles) for deterministic test pattern generation.

A system and method for time slicing deterministic patterns for reseeding in logic BIST is disclosed. The known properties of a linear feedback shift register (LFSR) and an associated set of channels are used in conjunction with a desired deterministic test pattern to create one or more seeds which can be used by the LFSR to generate the test pattern. The test pattern can be divided into a number of segments, with each segment having approximately the same number of "care" bits. The segments can be varied in length. The segments can be visualized as having rows of bits that span the set of channels. In one embodiment, the number of shifts required to fill a segment using a particular seed is stored along with the seed as a lifetime tag. During testing, each deterministic test pattern is generated by loading a seed into the LFSR and cycling the LFSR in accordance with the tag of that seed.

In an embodiment of the present invention, a modified STUMPS architecture having an LFSR, phase shifter, channel array, compactor, and a MISR is used to apply deterministic test patterns to a logic circuit. The deterministic patterns are generated by seeding the LFSR with a predetermined seed and cycling the LFSR for a prescribed number of times. The number of times that the LFSR is cycled for each seed is determined by the number of targeted "care bits" that are required by the test pattern(s) that can be encoded into a seed. This is dependent upon the length of the LFSR, and the desired probability of obtaining a system of independent equations for solution. The value of the seed and its associated lifetime are determined, in one implementation, by an ATPG process and systems of equations.

Another embodiment of the present invention includes automated test equipment (ATE) for testing circuits at the chip, board or system level. The ATE comprises a storage medium for optionally storing deterministic patterns seeds and their associated lifetime tags; a medium for optionally storing data output signatures; a computer for programmed test control; and, an interface to a circuit under test.

These and other objects and advantages of the present invention will no doubt become obvious to those of ordinary skill in the art after having read the following detailed description of the preferred embodiments which are illustrated in the various drawing figures.

DESCRIPTION OF THE PREFERRED EMBODIMENTS

In the following detailed description of the present invention, a system and method for time slicing deterministic patterns for reseeding in logic Built-In Self-Test; numerous specific details are set forth in order to provide a thorough understanding of the present invention. However, it will be obvious to one skilled in the art that the present invention may be practiced without these specific details. In other instances well known methods involving well-known circuits, test protocols, interfaces, etc., have not been described in detail so as not to unnecessarily obscure aspects of the present invention.

Notation and Nomenclature

Figure 5:
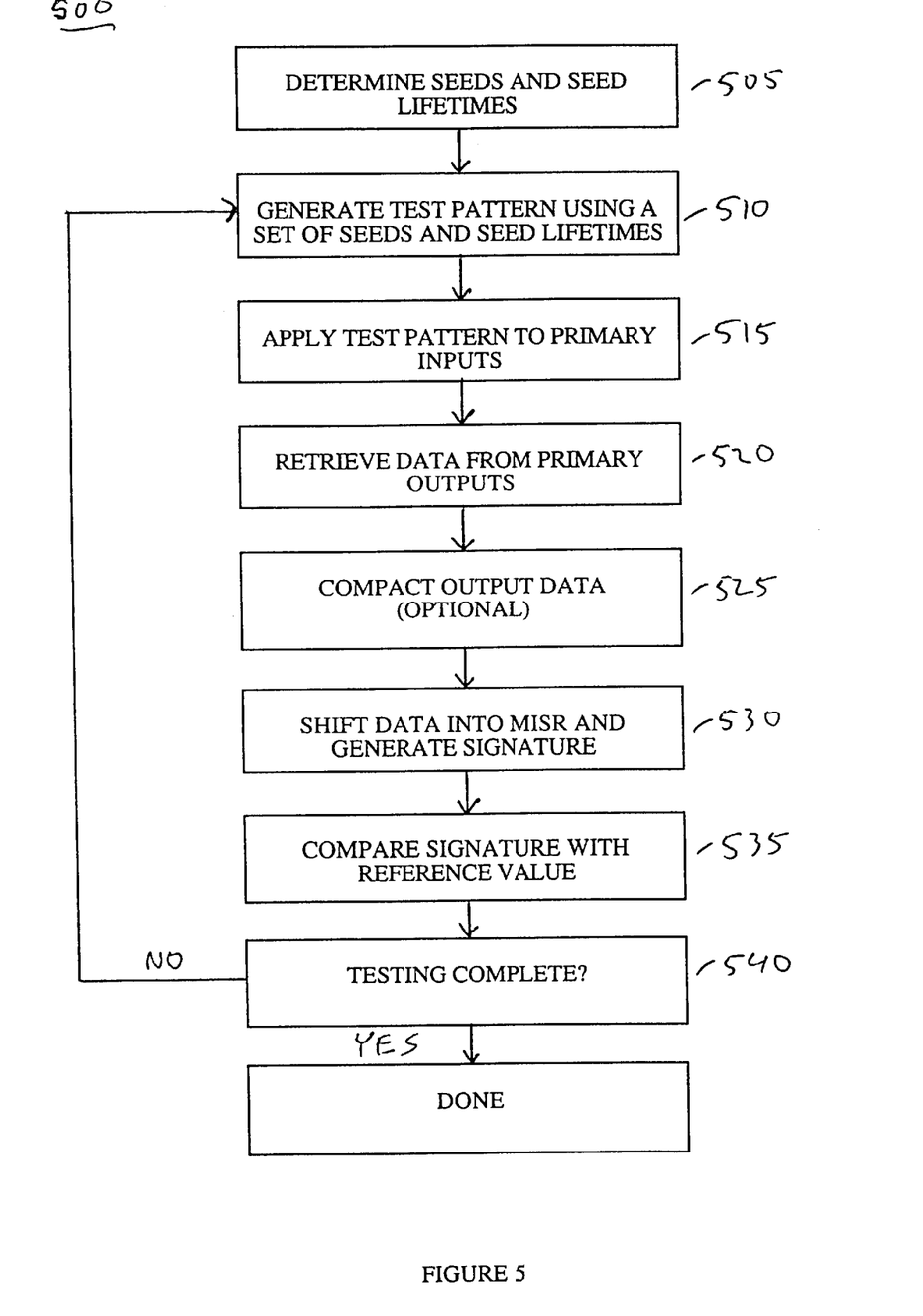
FIG. 5 shows a flow chart for deterministic testing of a circuit using a STUMPS architecture in accordance with an embodiment of the present claimed invention.
Figure 7:
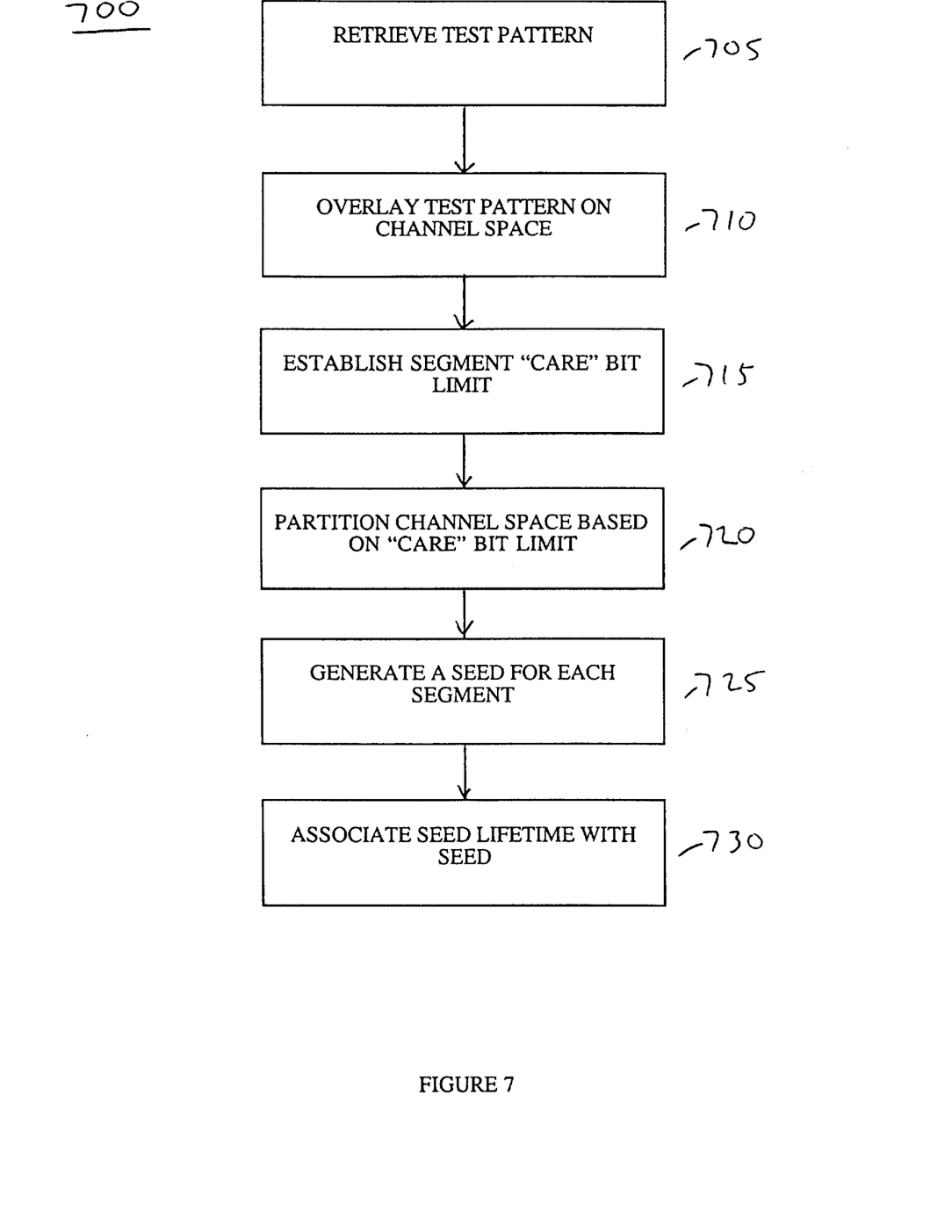
FIG. 7 shows a flow chart for the generation of a seed and its lifetime tag in accordance with an embodiment of the present claimed invention.

Some portions of the detailed descriptions which follow (e.g., processes 500, 700) are presented in terms of procedures, logic blocks, processing and other symbolic representations of operations on data bits within a computer memory. These descriptions and representations are the means used by those skilled in the data processing arts to most effectively convey the substance of their work to others skilled in the art. A procedure, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals a bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the disclosure of the present invention, terms such as "processing" or "computing" or "calculating" or "computing" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system's registers or memories or other such information storage, transmission or display devices.

Although built-in self-test (BIST) transfers a considerable amount of testing overhead from external automatic test equipment (ATE) to circuits embedded in the circuit under test, there is still a requirement for external control of the overall test flow, data logging, and data analysis.

Figure 1:
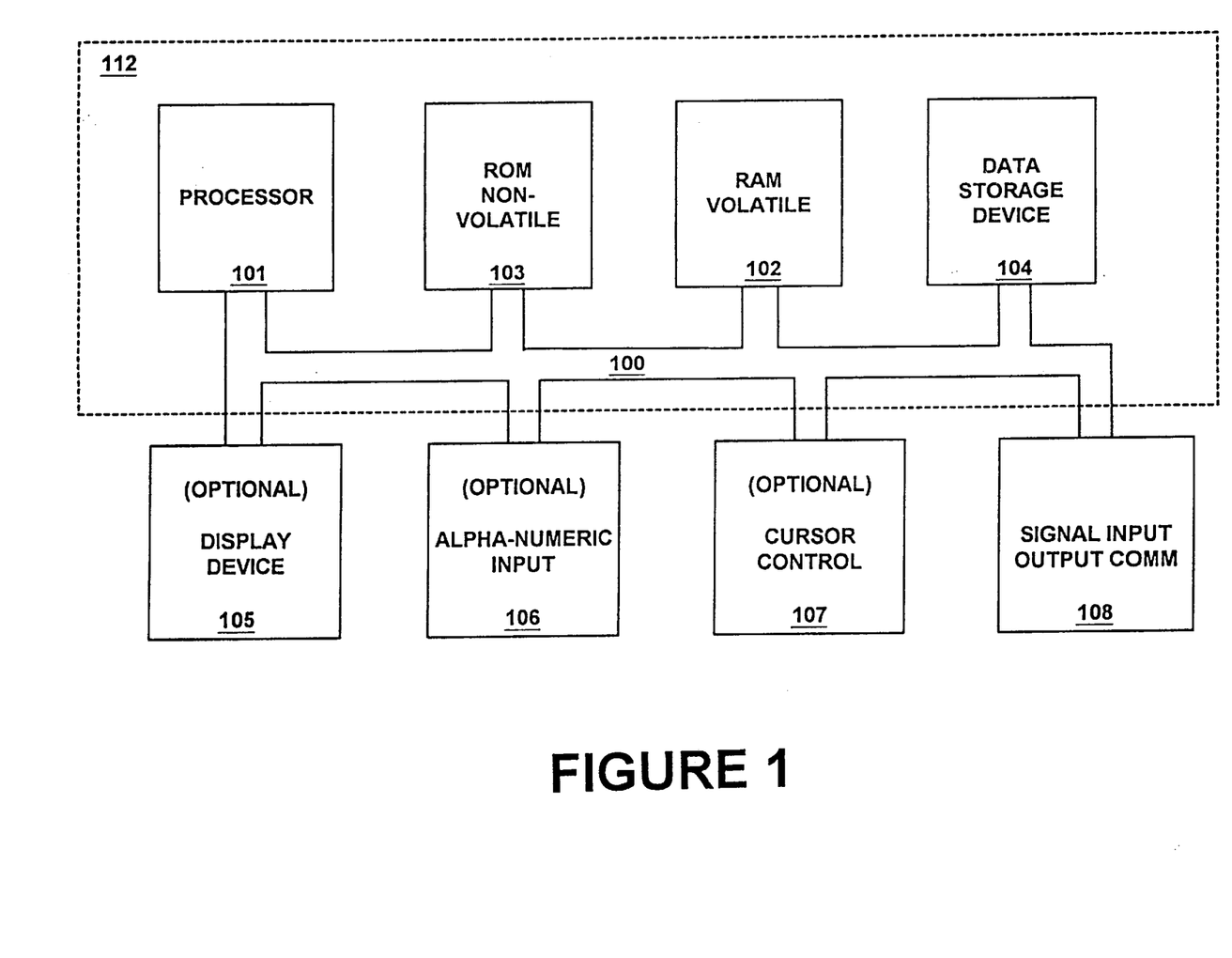
FIG. 1 is a diagram of a computer system portion of an automatic test equipment (ATE) system upon which embodiments of the present claimed invention may be practiced.

FIG. 1 illustrates an example of computer system 112 that can be used as an external controller for overall test flow control for a circuit using BIST. Within the following discussions of the present invention, certain processes and steps are discussed that are realized, in one embodiment, as a series of instructions (e.g. software program) that reside within computer readable memory units of system 112 and are executed by processors of system 112. When executed, the instructions cause computer system 112 to perform specific actions and exhibit specific behavior which is described in detail to follow.

In general, the system 112 of the present invention includes an address/data bus 100 for communicating information, one or more central processor(s) 101 coupled with bus 100 for processing information and instructions, a computer readable volatile memory unit 102 (e.g. random access memory, static RAM, dynamic RAM, etc.) coupled with bus 100 for storing information and instructions for the central processor(s) 101, a computer readable non-volatile memory unit 103 (e.g., read only memory, programmable ROM, flash memory, EPROM, EEPROM, etc.) coupled with bus 100 for storing static information and instructions for processor(s) 101.

System 112 of FIG. 1 can optionally include a mass storage computer readable data storage device 104, such as a magnetic or optical disk and disk drive coupled with bus 100 for storing information and instructions. Optionally, system 112 can also include a display device 105 coupled to bus 100 for displaying information to the computer user, an alphanumeric input device 106 including alphanumeric and function keys coupled to bus 100 for communicating information and command selections to central processor(s) 101, a cursor control device 107 coupled to bus 100 for communicating user input information and command selections to the central processor(s) 101, and a signal input/output device 108 coupled to the bus 100 for communicating messages, command selections, data, etc., to and from processor(s) 101. The signal input output device may provide the interface to the circuit (e.g., IEEE 1149.1).

Figure 2A:
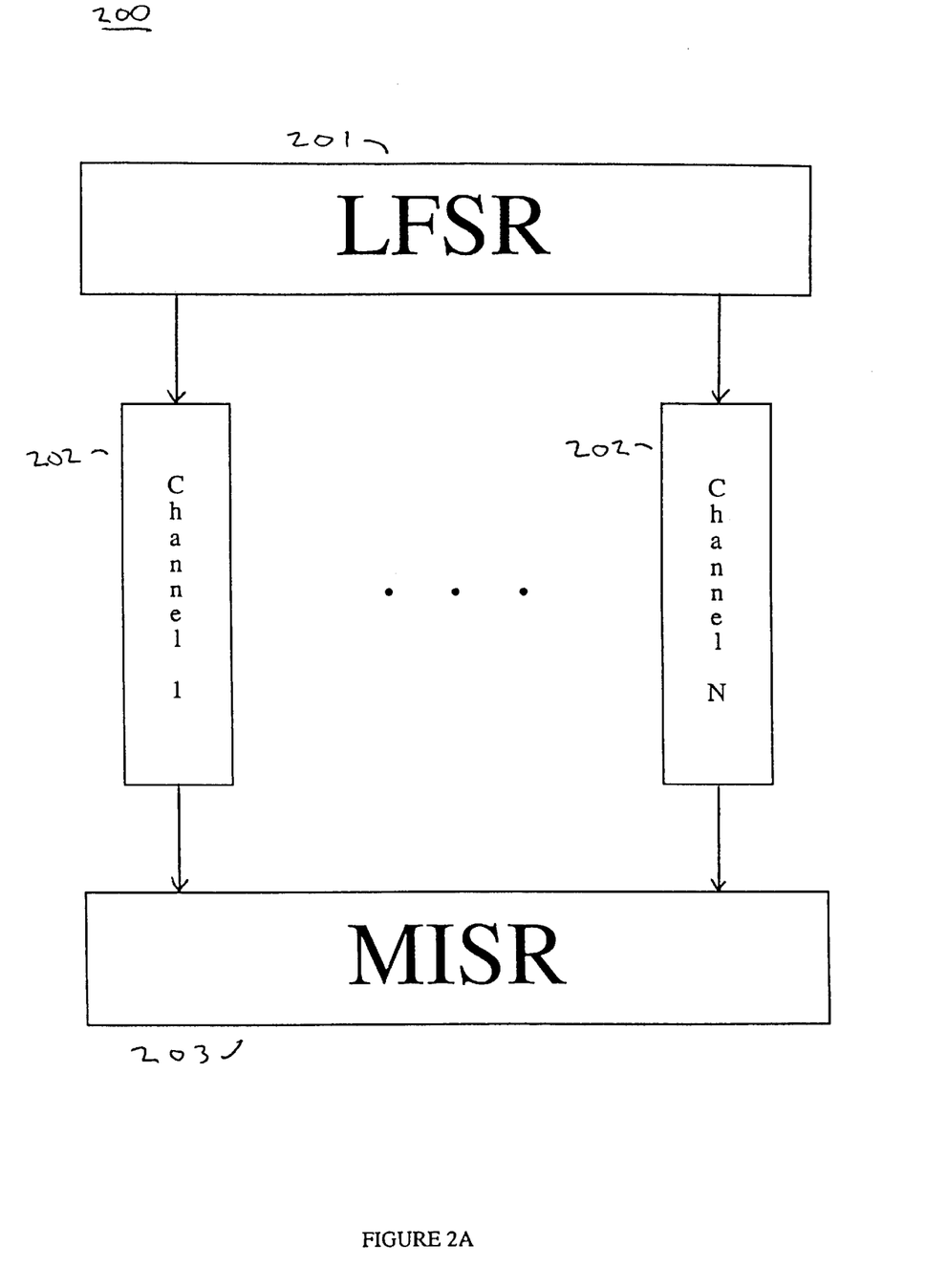
FIG. 2A illustrates a STUMPS (Self-Testing Using a MISR (multiple input signature register) and Parallel Shift Register Sequence Generator), as is well known in the art.

FIG. 2A shows a basic STUMPS (Self-Testing Using an MISR and Parallel Shift Register Sequence Generator) architecture 200 used for built-in self-test (BIST). Test pattern generation is performed by a linear feedback shift register (LFSR) 201 in a manner well known in the art. Such a system is described in U.S. Pat. No. 5,412,669, by Gruodis et al., issued May 2, 1995 and hereby incorporated by reference herein.

The LFSR 201 shown in FIG. 2A has length N with each of the N latches coupled to a corresponding channel 202. The LFSR is loaded with a seed in parallel or serial fashion, and subsequently cycled to generate a series of pseudo-random bit sequences that are shifted into the set of channels 202. Each channel comprises a series of latches coupled to the primary inputs and a primary outputs of a section of a circuit under test (DUT) (not shown). The channels 202 are serial shift registers, in one embodiment.

The total number of bits in an applied test pattern is the product of the LFSR length and the channel length. Once the channels 202 are filled, the test pattern is applied and the output data is shifted into the channels 201 and input to a multiple input signature register (MISR) 203.

The MISR 203 is a circuit that accepts a subset of the output data s et as parallel inputs and produces a signature with significantly fewer bits than the output data set. The signature produced is then compared in well known ways to a stored value to determine whether a fault exists.

Figure 2B:
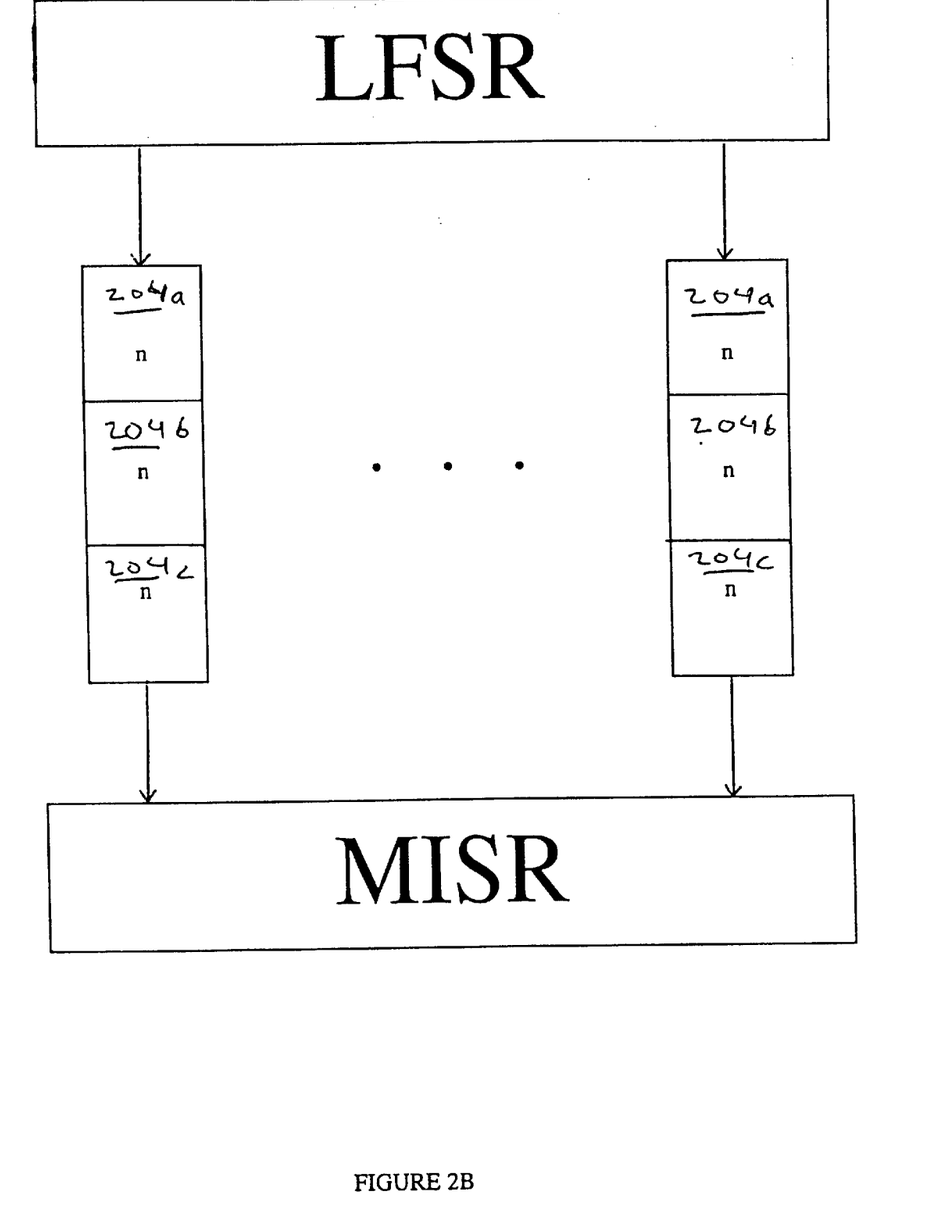
FIG. 2B shows a diagram for segment loading of a test pattern for the STUMPS architecture of FIG. 1.

FIG. 2B shows a conventional segmented channel loading of a test pattern by an LFSR. For pseudo-random testing, and frequently for deterministic testing in which the number of "care" bits is low, a single seed may be used to generate more than one test pattern. A seed is typically used for a fixed number of cycles. FIG. 2B shows each channel being divided into three segments 204a–204c having a uniform length n. When more than one seed is used to provide a test pattern, each channel segment is filled by cycling the LFSR n clock cycles per seed. Typically, only a portion of a channel comprises "care" bits.

Figure 3A:
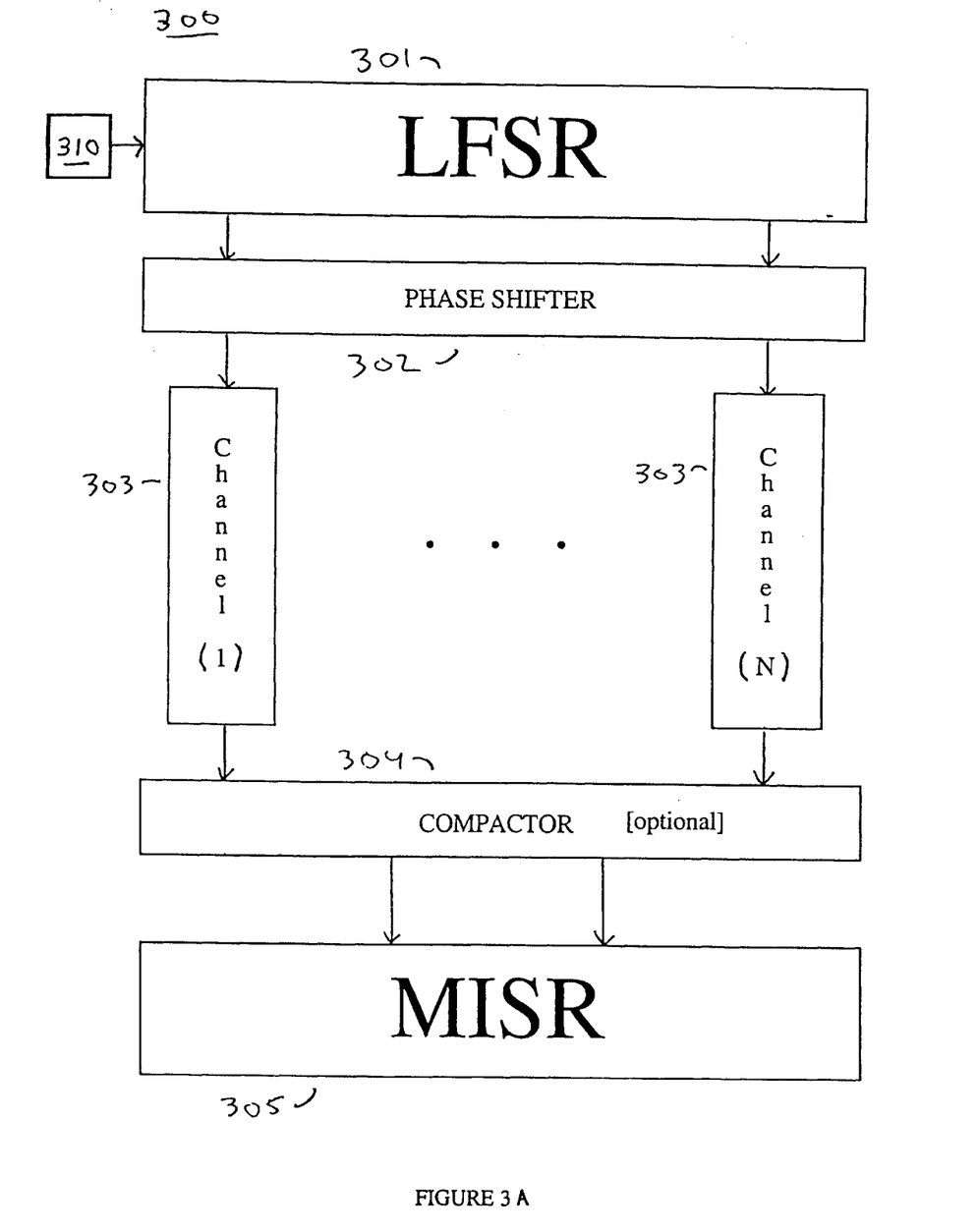
FIG. 3A illustrates a STUMPS (Self-Testing Using an MISR (multiple input signature register) and Parallel Shift Register Sequence Generator) architecture in accordance with an embodiment of the present claimed invention.

FIG. 3A shows a variation of the STUMPS implementation 300 in accordance with an embodiment of the present invention. As is well known, the circuit blocks are clocked. The LFSR 301 is similar to the LFSR 201 of FIG. 1. The seeds (initial state of the LFSR) that are loaded into the LFSR 301 may be provided externally by the automated test equipment (ATE) controlling the testing, or they may be stored in memory that is embedded in the DUT. Loading of the seeds 310 into the LFSR may be done serially or in parallel.

The LFSR 301 is coupled to a phase shifter 302. The phase shifter 302 allows the LFSR to support a number of channels that is greater than the number of latches in the LFSR. For example, an LFSR having 256 latches could support 512 channels. The phase shifter 302 also serves to decorrelate the bit sequences that are generated by the LFSR. The phase shifter 302 is well known in the art.

As shown in FIG. 3A, the output of the phase shifter 302 is connected to a series of N channels 303. Each channel 303 comprises a series of latches coupled to the primary inputs and a primary outputs of a section of a device under test (DUT) (not shown). The channels 303 are connected to an optional compactor 304. The compactor 303 is used to reduce the number of bits that are fed to the MISR 305. For example, data shifted into the compactor from 512 channels is XORed to produce 256 data streams, effectively reducing the number of channels by one half.

Since all errors in the output involving an odd number of bits will maintain their identity through the XOR operation, the compactor is able to reduce the data that must be handled by the MISR 305 by half, while still detecting the most probable 1-bit errors, as well as other odd-bit errors.

The output of the compactor 304 is fed into a MISR 305 that produces a signature for the compacted output data. The expected values to which the signatures are compared may be stored in memory integrated with the DUT, or they may be stored in memory associated with the ATE.

Figure 3B:
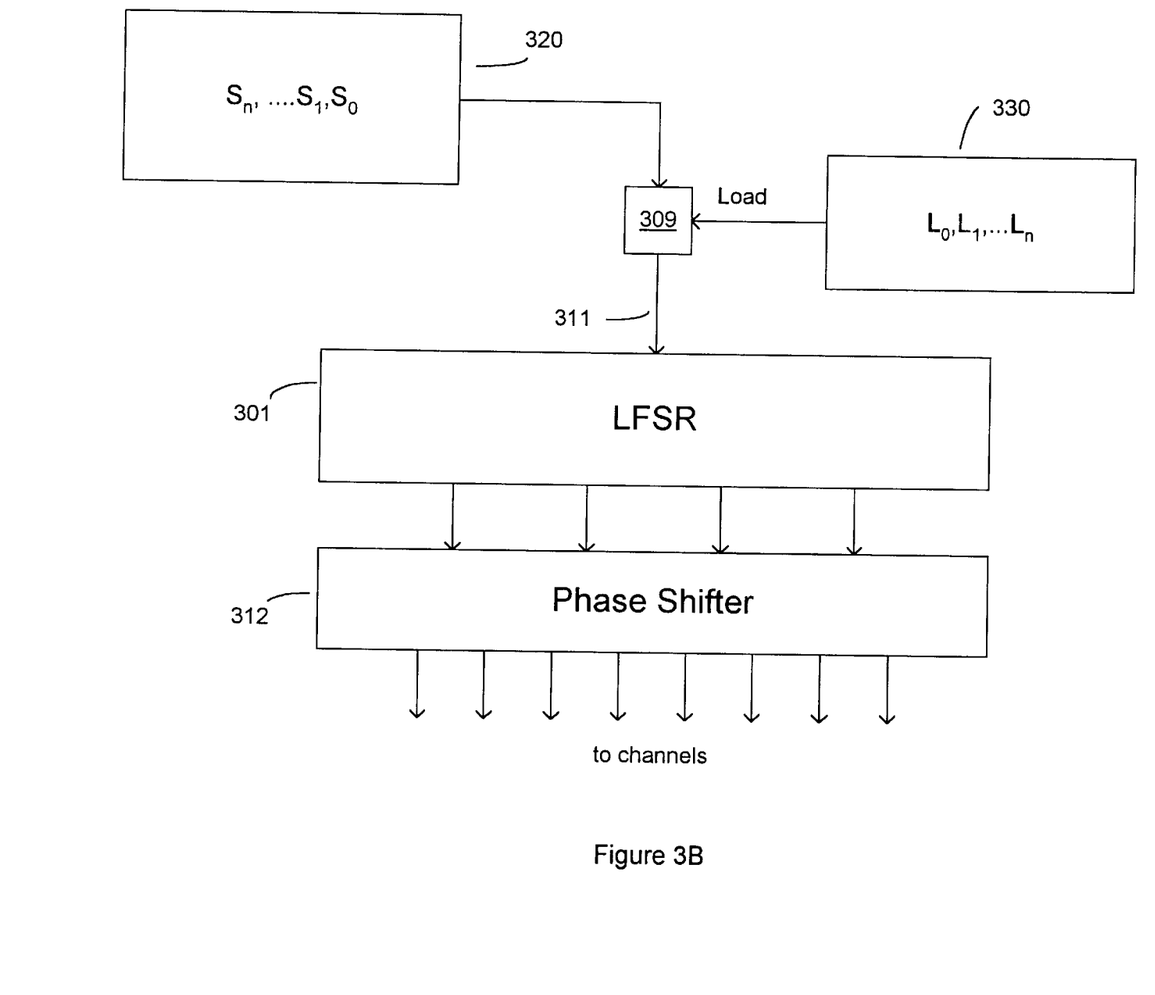
FIG. 3B illustrates a STUMPS (Self-Testing Using an MISR (multiple input signature register) and Parallel Shift Register Sequence Generator) architecture in accordance with an embodiment of the present claimed invention.

FIG. 3B illustrates a modified STUMPS (Self-Testing Using an MISR (multiple input signature register) and Parallel Shift Register Sequence Generator) architecture in accordance with an embodiment of the present claimed invention. A series of seeds ($S_n$, ... $S_1$, $S_0$) 320 are input to an LFSR 301 by latch control logic 309 using associated seed lifetimes ($L_n$, ... $L_1$, $L_0$) 330. The seeds are loaded into the LFSR 301 on the load path 311. The seed lifetimes are loaded into the seed latch control logic 309 that may include a seed lifetime control counter that is incremented or decremented to keep track of the number of shifts that have been applied to a seed. Alternatively, the seed lifetime may be provided to the latch control logic 309 as an encoded value that is subsequently decoded. The seed latch control logic 309 determines the number shifts that are performed. The output of the LFSR 301 is fed into a phase shifter 312.

Figure 4:
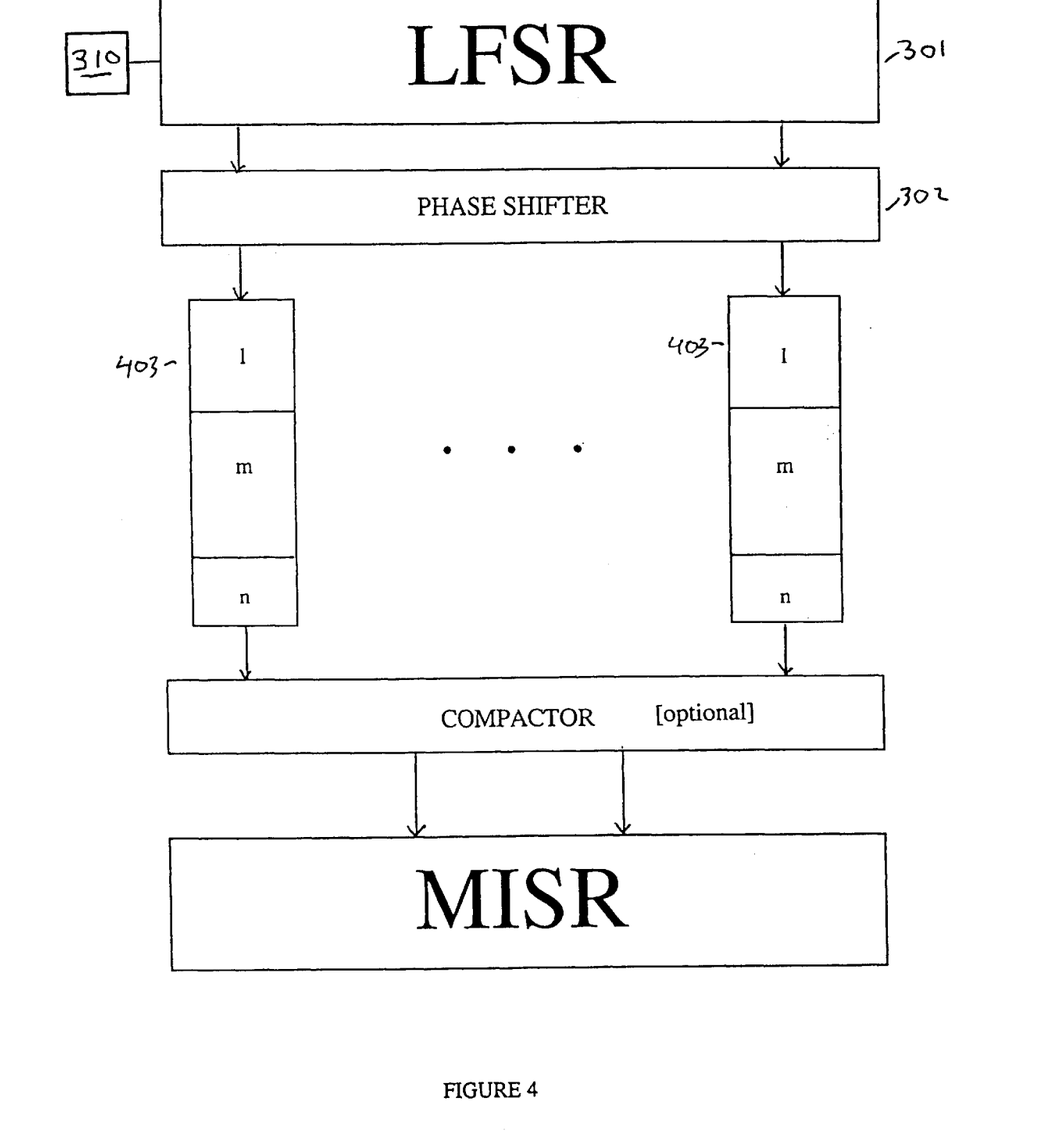
FIG. 4 shows a diagram for variable segment loading of a test pattern for the prior art STUMPS architecture of FIG. 1.

FIG. 4 shows the variable segment length channel loading of the present invention. The channels 403 are divided into segments of different lengths l, m, and n. The length of each segment is determined by the target number of "care" bits in each segment. The vast majority of faults for which test patterns are designed only require fixed values at a fraction of the primary inputs. These fixed values are known as "care" bits, and the remaining bits in the test pattern are known as "don't care" bits.

Since the loading of the channels is a deterministic process, a test pattern desired for application to the primary inputs of the DUT can be visualized in the channels, with each segment containing an integer number of bit sequences shifted out of the phase shifter. The "care" bits of a given test pattern will typically be distributed over the channels in a non-uniform fashion, with the number of "care" bits varying among the sequences that are shifted out of the phase shifter.

The lengths l, m, and n are measured in terms of the number of shifts (clock cycles) required to fill a segment, and the size of a segment is dependent upon the number of shifts that are required to reach a predetermined number of "care" bits.

Since the transformation and manipulation of bits by the LFSR 301 and phase shifter are deterministic processes, a bit sequence at the output of the phase shifter can be mapped back into an initial value (seed) in the LFSR 302. In testing it is desirable that the number of seeds that must stored and handled be minimized, and as such it is desirable to obtain as many care bits from a seed as is possible. However, probability of producing a desired number of "care bits" from a given seed decreases as the number of "care" bits of the test pattern(s) increases. The encoding of test patterns into seeds becomes very unlikely if the number of "care" bits needed exceeds the length of the seed.

For a seed with length y and a pattern with number of "care" bits x, the probability of failure (dependency) in obtaining a seed that will produce the desired pattern can be approximated for (x<y) by: $P(x,y)=1-\exp(-2^{(x-y)})$. For example, setting the number of "care" bits at 230 for a seed length of 256 gives a failure probability of 0.0000000149. On the other hand, setting the number of care bits equal to 250 gives a failure probability of 0.000976.

Thus, in the conventional approach of using each seed for a fixed number cycles, the number of cycles must be kept low in order to avoid having too many "care" bits in a single segment. A fixed number of cycles must be able to accommodate those segments of the test pattern having a high density of "care" bits.

In the present invention, the desired test pattern can be divided into channel segments having approximately equal numbers of "care" bits. Due to the non-uniformity of the "care" bit distribution, the resulting segments will have different overall numbers of bits, and require varying numbers of shifts of the LFSR to be filled.

A seed ($S_n$) is generated for each segment and is associated with a seed lifetime ($L_n$) that determines the number of shift cycles that are to be applied to the LFSR and phase shifter to fill the segment. The seed lifetime determines the fraction or multiple times that the channel is loaded.

By varying the length of each segment, the inefficiency of under-utilization of a seed can be minimized or reduced, and test integrity maintained by avoiding over-utilization of a seed.

FIG. 5 shows a computer controlled flow chart 500 for steps in a deterministic testing process of a circuit using a variation of the STUMPS architecture in accordance with an embodiment of the present claimed invention. In step 505, a set of seeds and seed lifetimes are produced corresponding to the set of deterministic test patterns that is to be applied. This can be accomplished using ATPG processes.

In step 510, a test pattern is generated in the circuit by repeated seeding and shifting of an LFSR. The number of shifts applied for each seed is determined by its associated lifetime. The loading of seeds into the LFSR and shifting is repeated until a full test pattern has been built. Each seed is loaded into the LFSR and the seed lifetime is loaded into a seed load control circuit, also called seed lifetime control counter (FIG. 3B). On each seed, another segment of the channels is filled. The channels are therefore filled from the bottom-up in accordance with one embodiment of the present invention.

In step 515, the test pattern that has filled the channels is applied to the primary inputs of the CUT. Each channel (scan chain) is associated with a portion of the DUT.

In step 520 the output data is retrieved from the primary outputs into the channels.

In step 525, the output data is optionally compacted.

In step 530 the output data (optionally compacted) is input to an MISR and a signature is generated.

In step 535, the signature is compared with a reference value to determine whether an error has occurred, and appropriate action is taken.

In step 540, a decision is made to continue testing if there are any more tests to apply, if there are not the test is complete.

Figure 6:
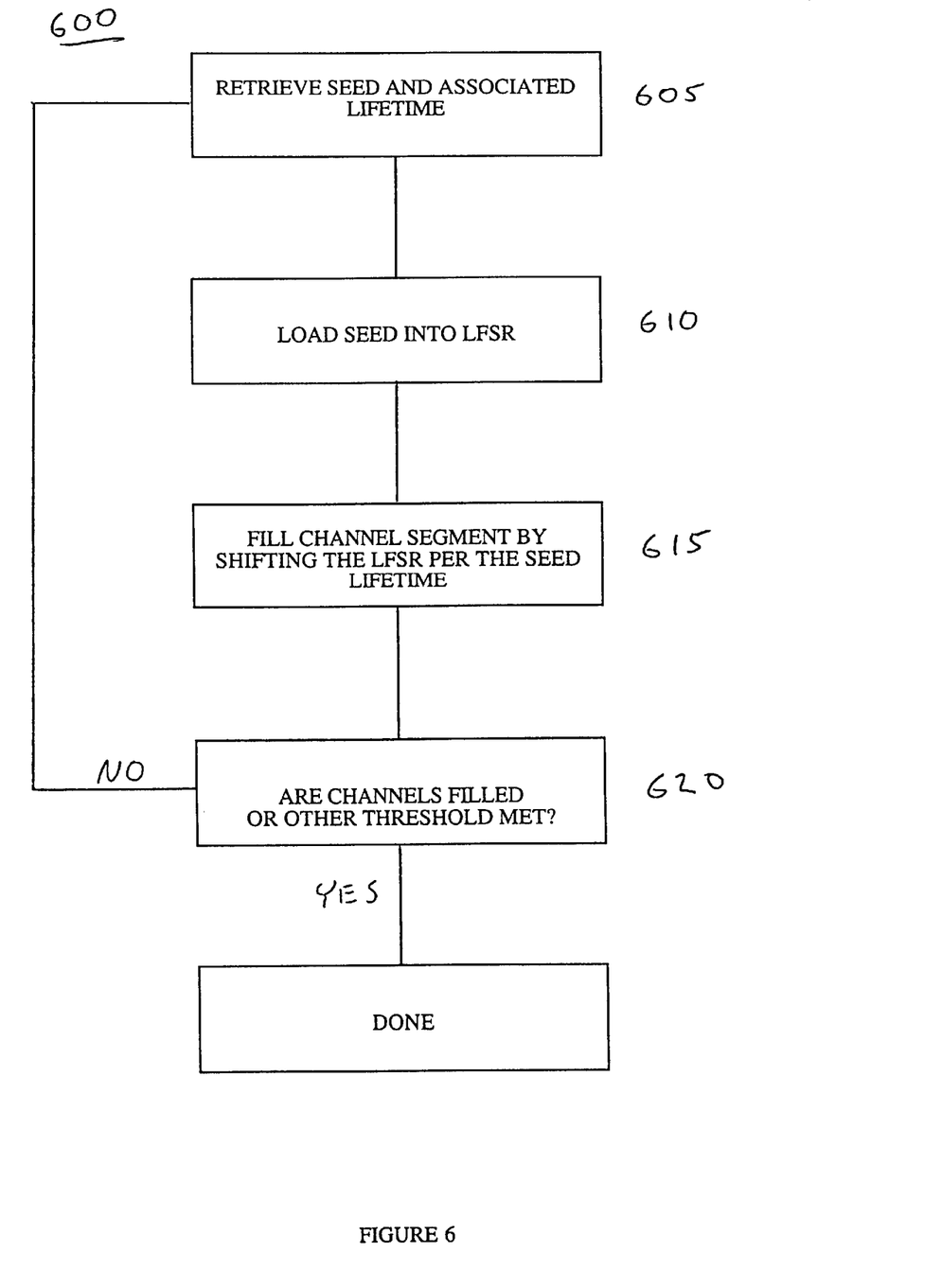
FIG. 6 shows a flow chart for the generation of a test pattern for BIST using a seed and seed lifetime in accordance with an embodiment of the present claimed invention.

FIG. 6 shows a flow chart 600 for the generation of a test pattern for BIST in a modified STUMPS architecture using a seed and seed lifetime in accordance with an embodiment of the present claimed invention. The flow chart 600 corresponds to step 510 of FIG. 5.

In step 605 of FIG. 6, a first seed and its associated lifetime are retrieved. The seed and lifetime may be retrieved from the ATE or the DUT.

In step 610, the seed is loaded into the LFSR and the seed lifetime is loaded into a lifetime control counter of the seed latch control logic (FIG. 3B) that controls the number of shifts made from the LFSR with the seed.

In step 615, a channel segment is loaded by shifting the LFSR by a number of times (clock cycles) equal to the seed lifetime associated with the seed. The seed lifetime may be stored in the test equipment or in memory integrated with the DUT.

In step 620, a determination is made as to whether the channels are filled or if some other threshold condition is met. If the channels are filled the test pattern is complete. If the channels are not filled then steps 605 through 615 are repeated until another threshold is met or until the channels are filled.

In step 625, the test pattern is applied to the primary inputs of the DUT. Although in this example, the test pattern was made up of two segments, it is to be understood that a test pattern may have more than two segments.

In step 630, the output data is compacted. Compaction of the data may be performed by applying an XOR operation that reduces the data volume by approximately one half, while preserving the identity of error involving an odd number of bits.

In step 635, the compacted data is shifted into a MISR for signature generation. The signature generated is then available for comparison to a reference value.

FIG. 7 shows a computer implemented (e.g., system 112) flow chart 700 for the generation of a seed and its lifetime tag in accordance with an embodiment of the present claimed invention. In step 705, a desired test pattern is retrieved, for example, from automated test pattern generation equipment (ATPG).

In step 710 the desired test pattern is overlaid on the channel space. The channel space is a two dimensional representation of the test pattern wherein the columns correspond to channels and rows correspond to the bit sequences that are shifted into the channels. The channel space may be rectangular, or slightly irregular if the channels are not all of the same length.

In step 715, a "care" bit limit is established. Based upon the test integrity, test efficiency, and possibly other requirements, the maximum number of "care" bits to be generated by a seed is determined.

In step 720, the channel space is partitioned on the basis of the "care" bit limit. An example of one partition scheme is to create as many partitions at the limit value as possible, with one partition having potentially fewer care bits than the limit, that is the remainder of the total "care" bits in the test pattern divided by the "care" bit limit. Another example, is to factor in the number of rows in the channel space during the selection of the care bit limit so that all of the segments are partitioned having one of two values that differ by one bit.

In step 725, a seed is generated for each segment. The seed generation is typically done by finding a solution for a system of linear equations. The number of equations and the unknowns to be solved for are determined by the length of the seed and the number of care bits.

In step 730, a seed lifetime is associated with the seed for each segment. The seed lifetime is the number of rows in the segment. The seed lifetime specifies the number of shifts that are applied to the LFSR for its associated seed.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

What is claimed is:

1. A method of generating a test pattern for built-in self-test with a circuit having a linear feedback shift register (LFSR), seed latch control logic, and a plurality of parallel channels, comprising:
    a) loading a seed into the LFSR;
    b) loading a seed lifetime into the seed latch control logic;
    c) shifting the LFSR per the seed lifetime to fill a channel segment with bit sequences originating from the LFSR; and,
    d) repeating a) through c) until the plurality of parallel channels have been filled with a test pattern, wherein at least two seed lifetimes have different values.

2. The method of claim 1, wherein the LFSR is coupled to the plurality of parallel channels by a phase shifter.

3. The method of claim 1, wherein the plurality of parallel channels is further coupled to a compactor.

4. The method of claim 1, wherein at least one seed is loaded into the LFSR for the creation of "care bits" required by one or more test patterns.

5. The method of claim 1, wherein said seed lifetime is selected to provide a specified number of "care" bits in the channel segments.

6. The method of claim 1, wherein all channel segments except one are filled with the same number of "care" bits.

7. The method of claim 1, wherein the number of "care" bits in any of the channel segments is limited to two possible values that differ by one bit.

8. A system for performing built-in self-test in a logic circuit comprising:
    an external controller for overall test flow control coupled to a circuit under test (CUT) having an LFSR coupled to a plurality of parallel channels coupled to a multiple input signature register (MISR), and a control counter;
    a first plurality of storage locations containing seed values; and;
    a second plurality of storage locations containing seed lifetime values, wherein each seed value has a respective seed lifetime value.

9. The system of claim 8, wherein the first plurality of storage locations containing seed values and the second plurality of storage locations containing seed lifetime values reside in the external controller.

10. The system of claim 8, wherein the first plurality of storage locations containing seed values and the second plurality of storage locations containing seed lifetime values reside in memory embedded in the CUT.

11. The system of claim 8, further comprising a phase shifter and wherein the LFSR is coupled to the plurality of parallel channels by the phase shifter.

12. The system of claim 8, further comprising a compactor and wherein the plurality of parallel channels is coupled to the MISR by the compactor.

13. A computer readable medium containing executable instructions which, when executed in a processing system, causes the system to perform the steps for testing a circuit having an LFSR and, a plurality of parallel channels composed of channel segments, coupled to the LFSR, and a seed lifetime control counter, comprising:
    a) loading a seed into the LFSR;
    b) loading a seed lifetime into a control counter;
    c) shifting the LFSR per the seed lifetime to fill a channel segment with bit sequences from the LFSR; and,
    d) repeating a) through c) until the parallel channels have been filled with a test pattern, wherein at least two seed lifetimes have different values.

14. The computer readable medium of claim 13, wherein the LFSR is coupled to the plurality of parallel channels by a phase shifter.

15. The computer readable medium of claim 13, wherein the plurality of parallel channels is further coupled to a compactor.

16. The computer readable medium of claim 13, wherein at least one seed is loaded into the LFSR more than once.

17. The computer readable medium of claim 13, wherein said seed lifetime is selected to provide a specified number of "care" bits in the channel segments.

18. The computer readable medium of claim 13, wherein all segments except one are filled with the same number of "care" bits.

19. The computer readable medium of claim 13, wherein the number of "care" bits in any of the segments is limited to two possible values that differ by one bit.

20. A testing circuit comprising:
    a pseudo random number generator for generating respective sets of pseudo random bits each set based on a respective pair of data comprising a seed and an associated seed lifetime; and
    a plurality of channels coupled to receive bits originating from said pseudo random number generator, wherein each pair of data generates a time slice of bits of variable length and comprising a separate segment located within each of said plurality of channels and wherein said plurality of channels are for containing a test vector comprising a plurality of time slices.

21. A testing circuit as described in claim 20 wherein said test vector is for application to an integrated circuit for testing thereof.

22. A testing circuit as described in claim 21 further comprising a phase shifter circuit coupled between said pseudo random number generator and said plurality of channels.

23. A testing circuit as described in claim 21 further comprising:

a compactor circuit coupled to outputs of said plurality of channels; and a MISR circuit coupled to an output of said compactor circuit.

24. A testing circuit as described in claim 21 wherein said pseudo random number generator comprises:

an LFSR circuit for receiving a seed and for generating a set of pseudo random bits therefrom over a sequence of clock cycles defined by said associated seed lifetime; and a control circuit for loading said seed into said LFSR and for clocking said LFSR over said seed lifetime.

25. A testing circuit as described in claim 21 wherein said plurality of channels comprise a plurality of serial shift registers.

26. A testing circuit as described in claim 21 wherein each time slice of bits comprise "care" bits and "don't care" bits.

* * * * *